United States Patent
Shin et al.

(10) Patent No.: US 10,075,153 B2
(45) Date of Patent: Sep. 11, 2018

(54) LOW-POWER CLOCK-GATED SYNCHRONIZER, A DATA PROCESSING SYSTEM THAT INCORPORATES THE SAME AND A SYNCHRONIZATION METHOD

(71) Applicant: SAMSUNG ELECTRONICS CO., LTD., Suwon-si, Gyeonggi-Do (KR)

(72) Inventors: Taek Kyun Shin, Gwangmyeong-si (KR); Jin Pyo Park, Yongin-si (KR); Soong Hyun Shin, Seoul (KR); Jung Hun Heo, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/390,813

(22) Filed: Dec. 27, 2016

(65) Prior Publication Data

US 2017/0230038 A1  Aug. 10, 2017

(30) Foreign Application Priority Data

Feb. 5, 2016  (KR) .................. 10-2016-0015256

(51) Int. Cl.
*H04L 7/00* (2006.01)
*H03K 5/135* (2006.01)
(Continued)

(52) U.S. Cl.
CPC .............. *H03K 5/135* (2013.01); *H03K 5/14* (2013.01); *H04L 7/0331* (2013.01); *H03K 2005/00078* (2013.01)

(58) Field of Classification Search
CPC ....... H04L 5/24; H04L 47/6245; H04L 47/39; H04L 49/109; H04L 7/0008;
(Continued)

(56) References Cited

U.S. PATENT DOCUMENTS

| 5,764,710 | A | * | 6/1998 | Cheng | .................. G06F 1/10 327/154 |
| 6,738,442 | B1 | | 5/2004 | Wilcox | |
| 6,987,825 | B1 | * | 1/2006 | Yoshimura | ............. H03K 5/135 327/144 |
| 7,443,218 | B2 | | 10/2008 | Onouchi et al. | |
| 7,772,906 | B2 | | 8/2010 | Naffziger | |
| 2004/0246810 | A1 | * | 12/2004 | Dike | .................. G11C 7/1072 365/233.1 |

(Continued)

FOREIGN PATENT DOCUMENTS

| JP | 10041789 | 2/1998 |
| JP | 2008103929 | 5/2008 |

(Continued)

*Primary Examiner* — Sam K Ahn
*Assistant Examiner* — Amneet Singh
(74) *Attorney, Agent, or Firm* — Volentine, Whitt & Francos, PLLC

(57) ABSTRACT

A low-power synchronizer circuit, a data processing circuit that incorporates the synchronizer circuit, and a synchronization method are provided. The synchronizer circuit includes a delay circuit for receiving and delaying an asynchronous input signal, a first flip-flop having an input terminal connected to an output terminal of the delay circuit, a clock terminal for receiving the asynchronous input signal, and a reset terminal for receiving the asynchronous input signal, a synchronizer connected to an output terminal of the first flip-flop, and a clock-gating circuit for receiving a clock signal and determining whether to supply the clock signal to the synchronizer in response to one of a first output value of the delay circuit and a second output value of the first flip-flop and a third output value of the synchronizer.

20 Claims, 8 Drawing Sheets

(51) Int. Cl.
*H03K 5/14* (2014.01)
*H04L 7/033* (2006.01)
*H03K 5/00* (2006.01)

(58) Field of Classification Search
CPC ..... H04L 7/0045; H04L 7/0276; H04L 25/24; H04L 7/0331; H04L 7/0338; H04L 7/0037; H03K 5/135; H03K 3/356156; H03K 3/35606; H03K 5/1534; H03K 19/018592; G06F 1/12; G06F 13/4226; G06F 17/5031; G06F 17/5045; G06F 17/5059; G06F 1/04; G06F 5/08; G06F 1/10; G11C 7/1087; G11C 7/109; G11C 7/1093; G11C 7/22; G11C 7/222
See application file for complete search history.

(56) References Cited

U.S. PATENT DOCUMENTS

| | | | |
|---|---|---|---|
| 2008/0028343 A1 | 1/2008 | Sato et al. | |
| 2013/0043915 A1* | 2/2013 | Gupta | G06F 5/08 327/145 |
| 2014/0184288 A1 | 7/2014 | Kim et al. | |
| 2014/0225655 A1 | 8/2014 | Rasouli et al. | |
| 2016/0363955 A1* | 12/2016 | Stevens | G06F 1/10 |

FOREIGN PATENT DOCUMENTS

| | | |
|---|---|---|
| KR | 0333663 | 4/2002 |
| KR | 20030002640 | 1/2003 |
| KR | 0609484 | 7/2006 |

* cited by examiner

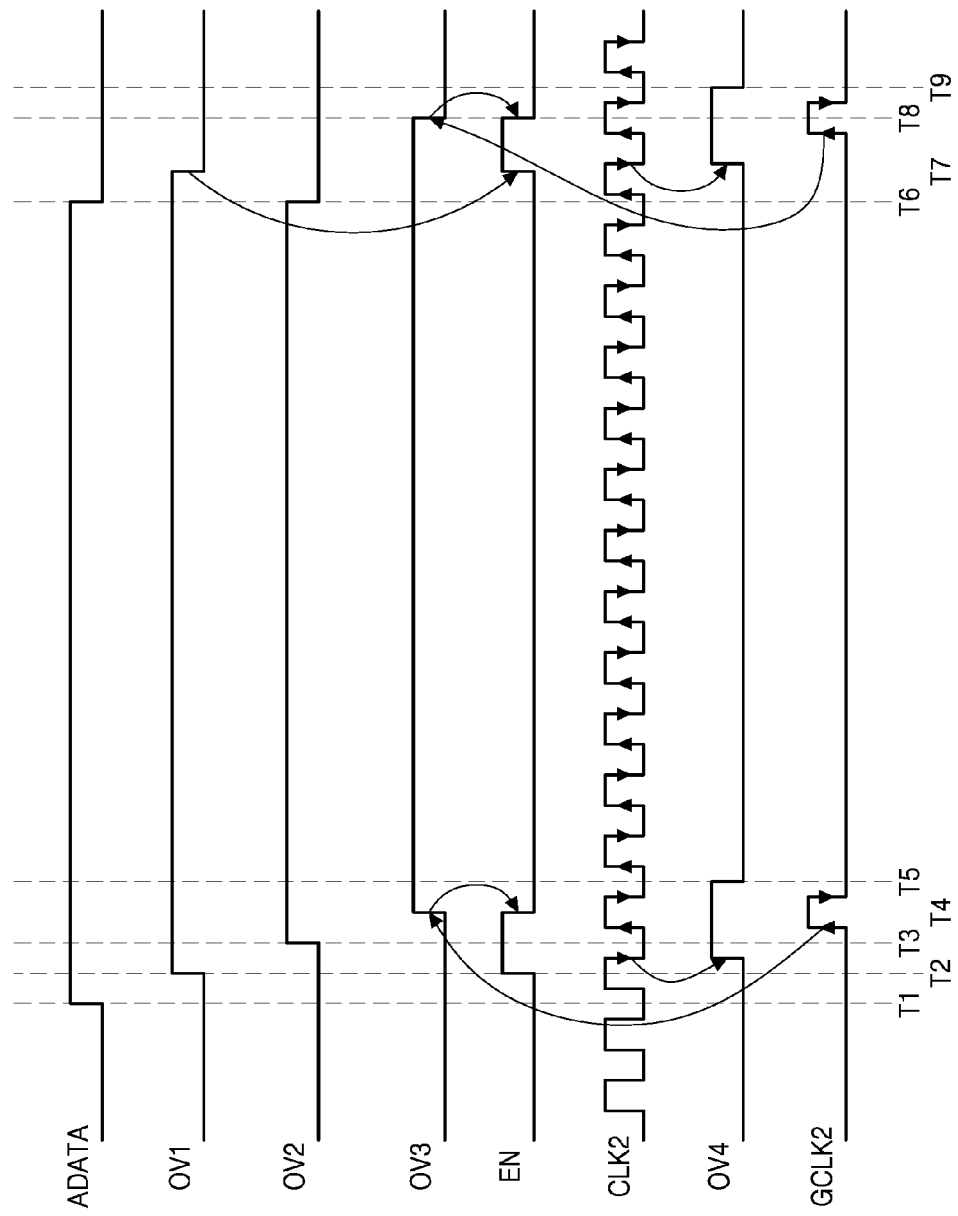

LOW-POWER CLOCK-GATED SYNCHRONIZER, A DATA PROCESSING SYSTEM THAT INCORPORATES THE SAME AND A SYNCHRONIZATION METHOD

PRIORITY STATEMENT

This application claims priority under 35 U.S.C. § 119 from Korean Patent Application No. 10-2016-0015256 filed on Feb. 5, 2016, the disclosure of which is hereby incorporated by reference in its entirety.

BACKGROUND

Clock gating is a technology used in a number of synchronizer circuits in order to reduce dynamic power loss.

An additional logic circuit is needed to supply or gate a clock signal. Since the additional logic circuit is capable of gating (or blocking) a clock signal supplied to a specific circuit when an operation of the specific circuit is not required, flip-flops included in the specific circuit do not switch a logic value and maintain an existing logic value when a clock signal is blocked. Switching a logic value of a flip-flop consumes power. When the logic value is not switched or changed, power consumption due to switching is zero and only power consumption due to leakage currents occurs. In general, since power is consumed in proportion to a frequency, the power consumption due to switching is zero when the frequency is zero.

Clock gating can be easily applied between the same clock domains. However, since a control signal for controlling clock gating included in one clock domain needs to be generated in another clock domain, complexity of an additional logic circuit for the clock gating is increased and the clock gating between the different, or heterogeneous, clock domains may be difficult to perform in some cases. The "same clock domains," as that phrase if used herein, means domains that use clock signals having the same frequency. The phrase "different clock domains," as that phrase is used herein, means the domains use clock signals that have different frequencies.

In some systems or device, such as in system on a chip (SOC), for example, multiple synchronizer circuits are often employed. Each of the synchronizer circuits consumes power, and the overall power consumed by all of the synchronizer circuits can reduce the battery lifetime of the device or system in which the synchronizer circuits are employed. Accordingly, a need exists for a synchronizer circuit that consumes a relatively low amount of power, thereby increasing the battery lifetime of the system or device in which the synchronizer circuit is employed.

SUMMARY

The present inventive concepts are directed to a synchronizer circuit, a data processing circuit that incorporates the synchronizer circuit and a synchronization method. The synchronizer circuit comprises a delay circuit for receiving and delaying an asynchronous input signal, a first flip-flop having an input terminal connected to an output terminal of the delay circuit, a clock terminal for receiving the asynchronous input signal, and a reset terminal for receiving the asynchronous input signal, a synchronizer connected to an output terminal of the first flip-flop, and a clock-gating circuit. The clock-gating circuit receives a clock signal and determines whether to supply the clock signal to the synchronizer in response to one of a first output value of the delay circuit and a second output value of the first flip-flop and a third output value of the synchronizer.

The data processing system comprises a transmitter circuit operating using a first clock signal having a first frequency, a receiver circuit operating using a second clock signal having a second frequency different from the first frequency, and a transmission medium connected between the transmitter circuit and the receiver circuit. The receiver circuit comprises a delay circuit for receiving and delaying a data signal received through the transmission medium, a first flip-flop having an input terminal connected to an output terminal of the delay circuit, a clock terminal for receiving the asynchronous input signal, and a reset terminal for receiving the asynchronous input signal, a synchronizer connected to an output terminal of the first flip-flop, and a clock-gating circuit that receives the second clock signal and determines whether to supply the second clock signal to the synchronizer in response to one of a first output value of the delay circuit and a second output value of the first flip-flop and a third output value of the synchronizer.

The synchronization method comprises delaying an asynchronous input signal to the synchronizer circuit to produce a delayed asynchronous input signal, receiving the delayed asynchronous input signal at an input terminal of a first flip-flip of the synchronizer circuit and latching the delayed asynchronous input signal into the first flip-flop, applying the asynchronous input signal to a clock terminal of the first flip-flop and applying an inverse of the asynchronous input signal to a reset terminal of the first flip-flop, receiving an output signal of the first flip-flop at an input terminal of a synchronizer of the synchronizer circuit, receiving a clock signal at a clock-gating circuit of the synchronizer circuit, and, in the clock-gating circuit, determining whether to supply the clock signal to the synchronizer based on values of the asynchronous input signal over a time period made up of multiple cycles of the clock signal.

These and other features and advantages of the inventive concepts will become apparent from the following description, drawings and claims.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 3 is a timing diagram which describes an operation of the synchronizer circuit shown in FIG. 2A;

DETAILED DESCRIPTION OF THE EMBODIMENTS

Figure 1:
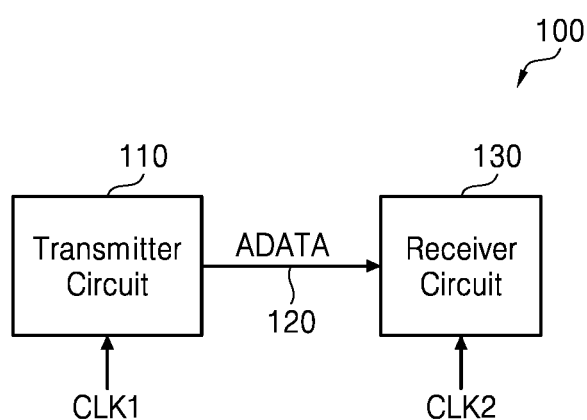
FIG. 1 is a block diagram of a data processing system according to exemplary embodiments of the present inventive concepts.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a block diagram of an example of a data processing system according to the present inventive concepts. Referring to FIG. 1, a data processing system 100 may include a transmitter circuit 110, a transmission medium 120, and a receiver circuit 130.

The transmitter circuit 110 may transmit a data signal, ADATA, to the receiver circuit 130 through the transmission medium 120.

The transmitter circuit 110 may refer to a circuit operating according to a first clock signal, CLK1, having a first frequency and the receiver circuit 130 may refer to a circuit operating according to a second clock signal, CLK2, having a second frequency that is different from the first frequency. The transmitter circuit 110 may be included in a first clock domain and the receiver circuit 130 may be included in a second clock domain.

Because the first frequency and the second frequency are different from each other, the data signal ADATA output from the transmitter circuit 110 is an asynchronous signal from a view point of the receiver circuit 130. Accordingly, the receiver circuit 130 includes a synchronizer circuit 131A-1, 131A-2, or 131B to be described referring to FIG. 2A, 2B, or 4, respectively. The synchronizer circuit 131A-1, 131A-2, or 131B may synchronize the data signal ADATA received through the transmission medium 120 to a second clock signal CLK2 of the receiver circuit 130.

The transmitter circuit 110 and the receiver circuit 130 may be integrated together in the same semiconductor chip (or die) or they may be formed in separate semiconductor chips (or dies). The data processing system 100 may be implemented as a system on chip (SOC), an application processor, a processor, or a central processing unit (CPU), an application specific integrated circuit (ASIC), combinational logic gates, etc.; however, it is not limited thereto. The term "processor," as that term is used herein, is intended to denote these and other computational devices that are suitable for this purpose. In addition, the transmitter circuit 110 may be a memory device and the receiver circuit 130 may be a processor; however, they are not limited thereto. The memory device may be a volatile memory device or a non-volatile memory device.

The transmission medium 120 may collectively or conceptually represent one or more transmission lines, or may refer to a bus.

The transmitter circuit 110 and the receiver circuit 130, as respective function blocks used in the data processing system 100, may refer to, for example, a CPU, a processor, each core of a multi-core processor, a memory device, a universal serial bus (USB) device, a peripheral component interconnect (PCI) device, a digital signal processor (DSP), a wired interface, a wireless interface, a controller, a codec, a video module (for example, a camera interface, a Joint Photographic Experts Group (JPEG) processor, a video processor, or a mixer), a 3-dimensional (3D) graphic core, an audio system, or a driver.

Function blocks employed in the data processing system 100 may be implemented in hardware or in a combination of hardware and software and/or firmware.

According to an example of inventive concepts, the data processing system 100 including the components 110, 120, and 130 may be embodied in a mobile device. The mobile device may be embodied in, for example, a laptop computer, a mobile phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an internet of things (IoT) device, an internet of everything (IoE) device, a drone, or an automotive system. The automobile system may include an engine control unit (ECU).

Figure 2A:
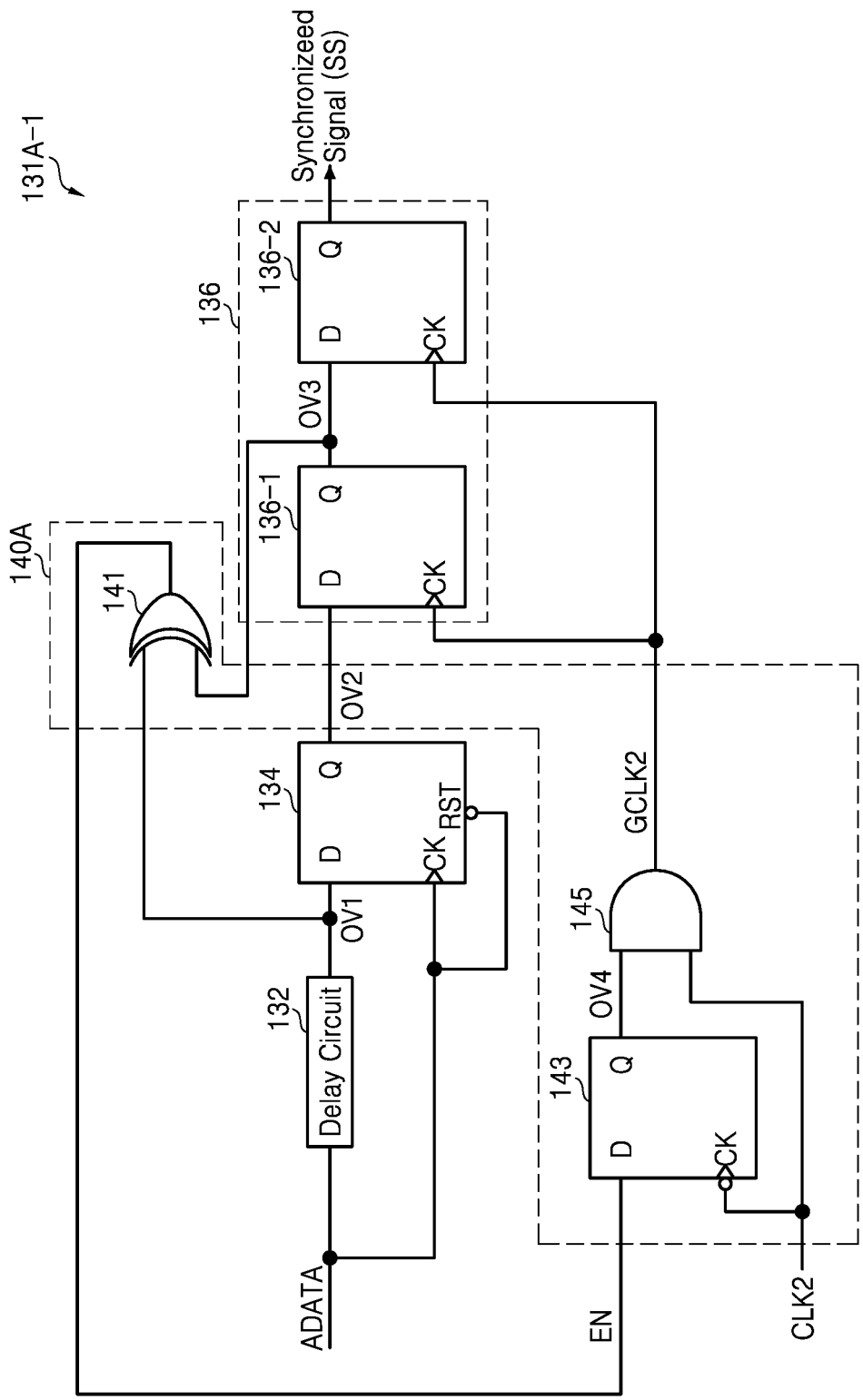
FIG. 2A is a block diagram of a synchronizer circuit included in a receiver circuit shown in FIG. 1 according to an exemplary embodiment of the present inventive concepts.
Figure 5:
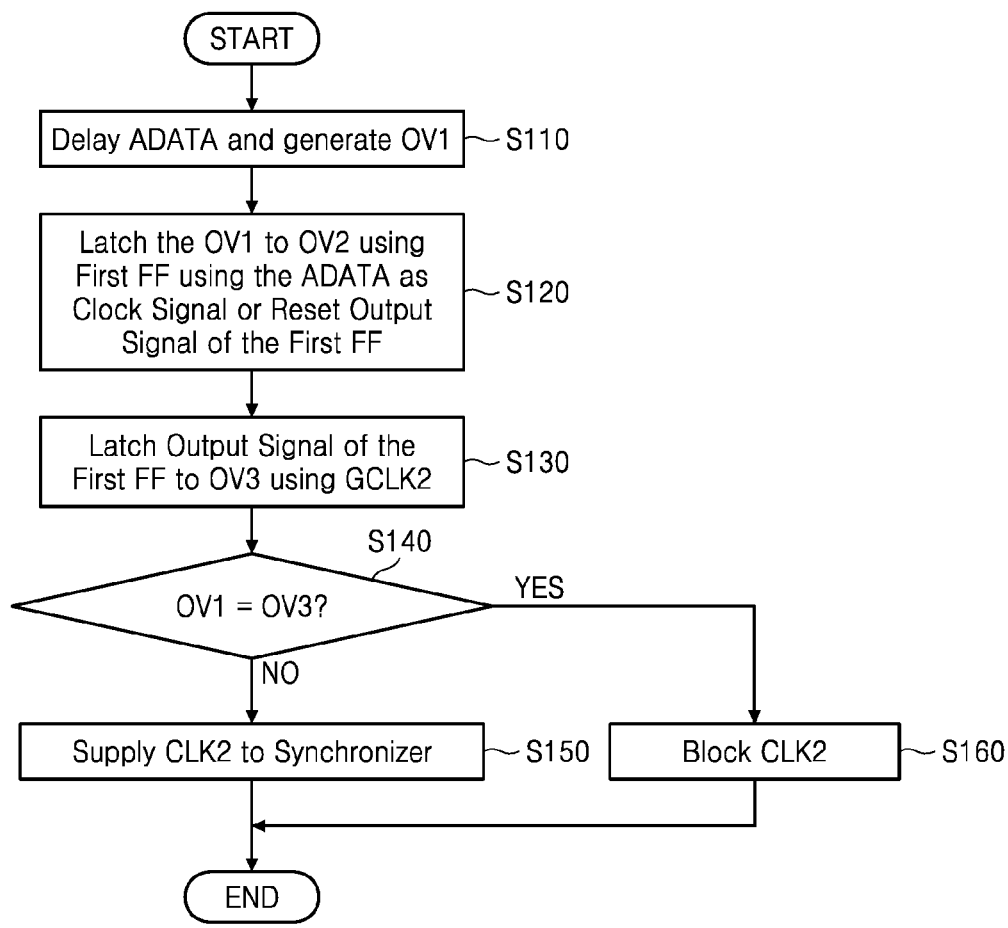
FIG. 5 is a flowchart which describes an operation of the synchronizer circuit shown in FIG. 2A.

FIG. 2A is a block diagram of an example of a synchronizer circuit included in the receiver circuit shown in FIG. 1 according to the present inventive concepts FIG. 5 is a flowchart that describes an operation of the synchronizer circuit shown in FIG. 2A. Referring to FIGS. 1, 2A, and 5, the synchronizer circuit 131A-1 included in the receiver circuit 130 may include a delay circuit 132, a first flip-flop 134, a synchronizer 136, and a clock-gating circuit 140A.

The delay circuit 132 may function as a buffer. The delay circuit 132 may receive and delay an asynchronous input signal, e.g., a data signal ADATA, received through the transmission medium 120, and output a first output value OV1 (S110).

The first flip-flop 134 may include an input terminal D connected to an output terminal of the delay circuit 132, a clock terminal CK for receiving a data signal ADATA, and a reset terminal RST for receiving the data signal ADATA. The first flip-flop 134 may function as a detector for detecting a logic value transition of the data signal ADATA.

The data signal, i.e., the first output value OV1, delayed by the delay circuit 132 may be used as an input signal input to the input terminal D of the first flip-flop 134, and the data signal ADATA itself may be used as a clock signal input to the clock terminal CK of the first flip-flop 134.

Figure 2B:
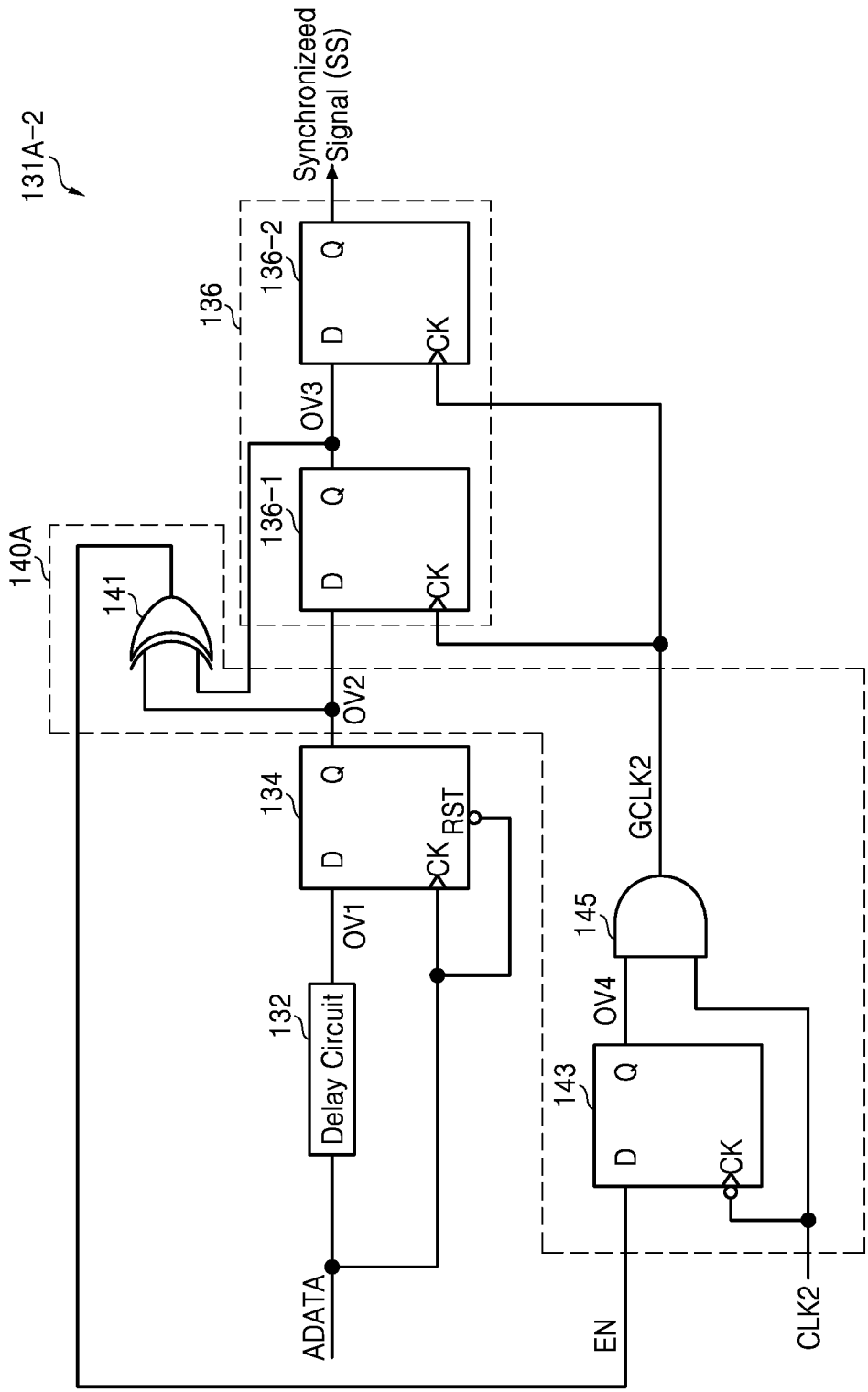
FIG. 2B is a block diagram of the synchronizer circuit included in a receiver circuit shown in FIG. 1 according to an exemplary embodiment of the present inventive concepts.
Figure 4:
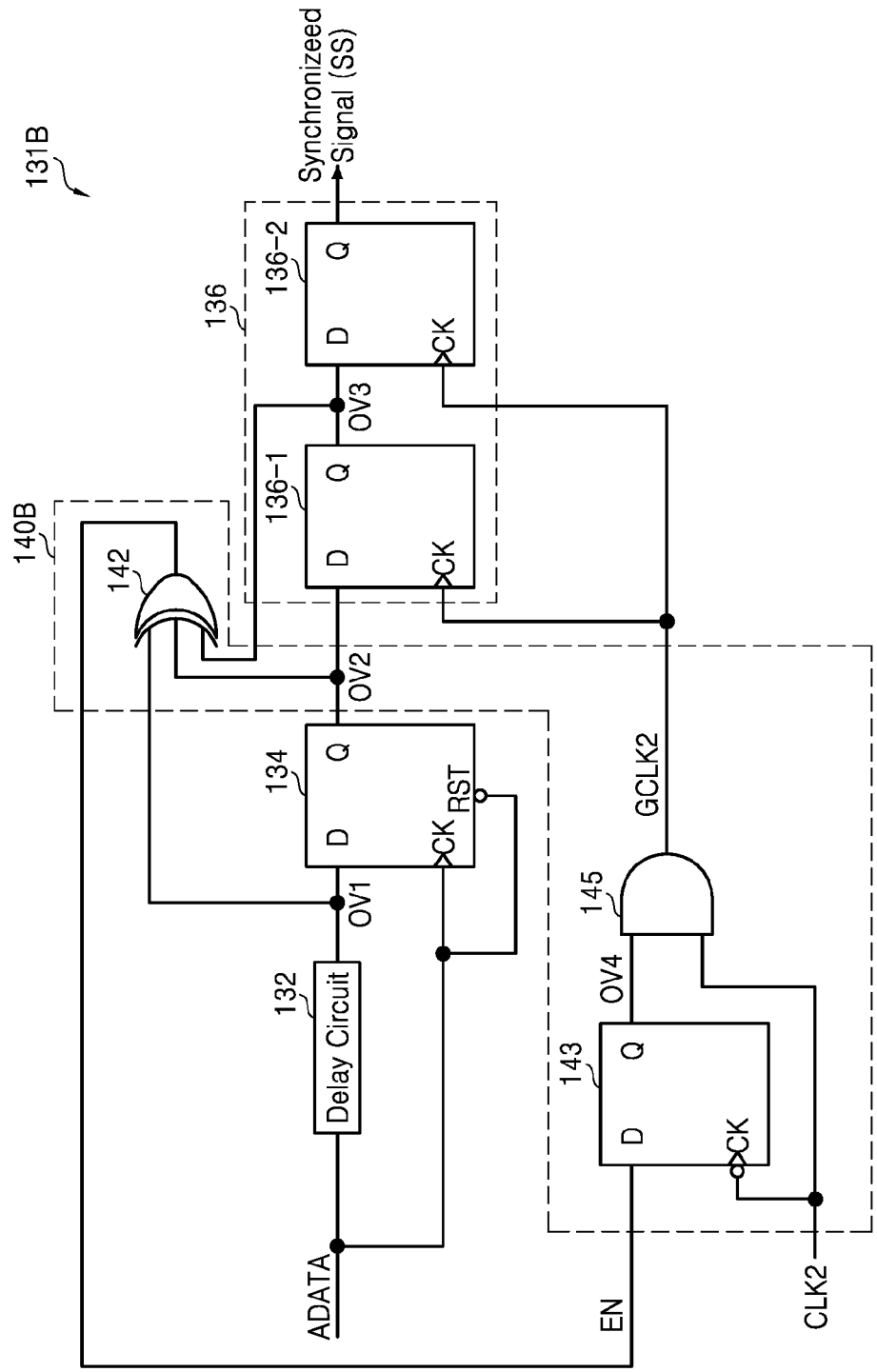
FIG. 4 is a block diagram of the synchronizer circuit included in the receiver circuit shown in FIG. 1 according to an exemplary embodiment of the present inventive concepts.

As shown in FIG. 2A, 2B, or 4, the first flip-flop 134 may be embodied in a positive edge triggered D-flip-flop having the reset terminal RST, and the first flip-flop 134 is reset when a value of the data signal ADATA is a second logic value (logic 0 or low level).

Alternatively, the first flip-flop 134 may be replaced with a negative edge triggered D flip-flop having the reset terminal RST, and the negative edge triggered D flip-flop may be reset when a value of the data signal ADATA is a first logic value (logic 1 or high level).

When the data signal ADATA is logic 1, the first flip-flop 134 may latch the first output value OV1, i.e., logic 1, of the delay circuit 132, and the first flip-flop 134 is reset when the data signal ADATA is logic 0 (S120).

The synchronizer 136 is connected to an output terminal Q of the first flip-flop 134. The synchronizer 136 may synchronize the data signal ADATA output from the transmitter circuit 110 to a second clock signal CLK2.

The synchronizer 136 may include a first-stage D flip-flop 136-1 and a second-stage D flip-flop 136-2 connected to each other in series. A second output value OV2 of the first flip-flop 134 is input to an input terminal D of the first-stage D flip-flop 136-1. Although each of the flip-flops 136-1 and 136-2 is shown as being a positive edge triggered D flip-flop, each of the flip-flops 136-1 and 136-2 may be replaced with a negative edge triggered D flip-flop.

The first-stage D flip-flop 136-1 captures a data value of the data signal ADATA at a rising edge of an operation clock signal GCLK2=CLK2 output from the clock-gating circuit 140A, and outputs a captured data value, e.g., a third output value OV3, until a next rising edge of the operation clock signal GCLK2=CLK2 occurs. The second-stage D flip-flop 136-2 captures a third output value OV3 of the first-stage D flip-flop 136-1 at the rising edge of the operation clock signal GCLK2=CLK2 output from the clock-gating circuit 140A, and outputs a captured data value SS until a next rising edge of the operation clock signal GCLK2=CLK2. Each of the values OV1, OV2, OV3, and SS may be logic 0 or logic 1. The operation clock signal GCLK2 may be a second clock signal CLK2 or a DC signal (or a fixed clock signal).

The first stage D flip-flop 136-1 may latch the second output value OV2 to the third output value OV3 using the operation clock signal GCLK2 output from the clock-gating circuit 140A or maintain the third output value OV3 (S130). That is, the value that is at the Q output of the first-stage D flip-flop 136-1 will change from the third output value that is currently at the Q output OV3 to the second output value OV2 that is currently at the D input if the operation clock signal GCLK2 output from the clock-gating circuit 140A is supplied to the synchronizer 136. Alternatively, if the operation clock signal GCLK2 is blocked, then the value that is at the Q output of the first-stage flip-flop 136-1 will remain unchanged, i.e., the third output value OV3.

For example, when the second clock signal CLK2 is supplied to the synchronizer 136, the value that is at the Q output of the first-stage D flip-flop 136-1 changes from the third output value OV3 to the second output value OV2. However, when the second clock signal CLK2 is not supplied to the synchronizer 136 (i.e., the second clock signal CLK2 is blocked), the value that is at the Q output of the first-stage D flip-flop 136-1 remains the third output value OV3.

The clock-gating circuit 140A may receive the second clock signal CLK2 and determine whether to supply the second clock signal CLK2 to the synchronizer 136 in response to the first output value OV1 of the delay circuit 132 and the third output value OV3 of the first-stage D flip-flop 136-1.

The clock-gating circuit 140A may include a comparator 141, a second flip-flop 143, and a transmission control circuit 145. The comparator 141 may compare the first output value OV1 with the third output value OV3 and generate a comparison signal EN. The comparator 141 may be embodied in an exclusive OR (XOR) gate. The comparator 141 compares the first output value OV1 with the third output value OV3 (S140), and outputs a comparison signal EN.

When the first output value OV1 and the third output value OV3 are the same as each other (YES in S140), the comparator 141 outputs a comparison signal EN having logic 0. Accordingly, since the second flip-flop 143 outputs a fourth output value OV4 having logic 0 in response to a falling edge of the second clock signal CLK2, the transmission control circuit 145 outputs an operation clock signal GCLK2 having logic 0 (or DC level) to the synchronizer 136. That is, the clock-gating circuit 140A does not supply a toggling or oscillating second clock signal CLK2 to the synchronizer 136 (S160).

When the first output value OV1 and the third output value OV3 are different from each other (NO in S140), the comparator 141 outputs a comparison signal EN having logic 1. Accordingly, since the second flip-flop 143 outputs a fourth output value OV4 having logic 1 in response to the falling edge of the second clock signal CLK2, the transmission control circuit 145 outputs the second clock signal CLK2 as the operation clock signal GCLK2. That is, the clock-gating circuit 140A supplies the second clock signal CLK2 to the synchronizer 136 (S150).

The second flip-flop 143 may latch a logic value of the comparison signal EN in response to the falling edge of the second clock signal CLK2. The second flip-flop 143 may be embodied in the negative edge triggered D flip-flop including an input terminal D for receiving the comparison signal EN and a clock terminal CK for receiving the second clock signal CLK2. Alternatively, the second flip-flop 143 may be replaced with the positive edge triggered D flip-flop including the input terminal D for receiving the comparison signal EN and the clock terminal CK for receiving the second clock signal CLK2.

The transmission control circuit 145 may control transmission of the second clock signal CLK2 according to the fourth output value OV4 of the second flip-flop 143. The transmission control circuit 145 may be embodied in an AND gate circuit. The transmission control circuit 145 may function as a mask circuit for controlling the transmission of the second clock signal CLK2 according to the fourth output value OV4 of the second flip-flop 143.

Figure 6:
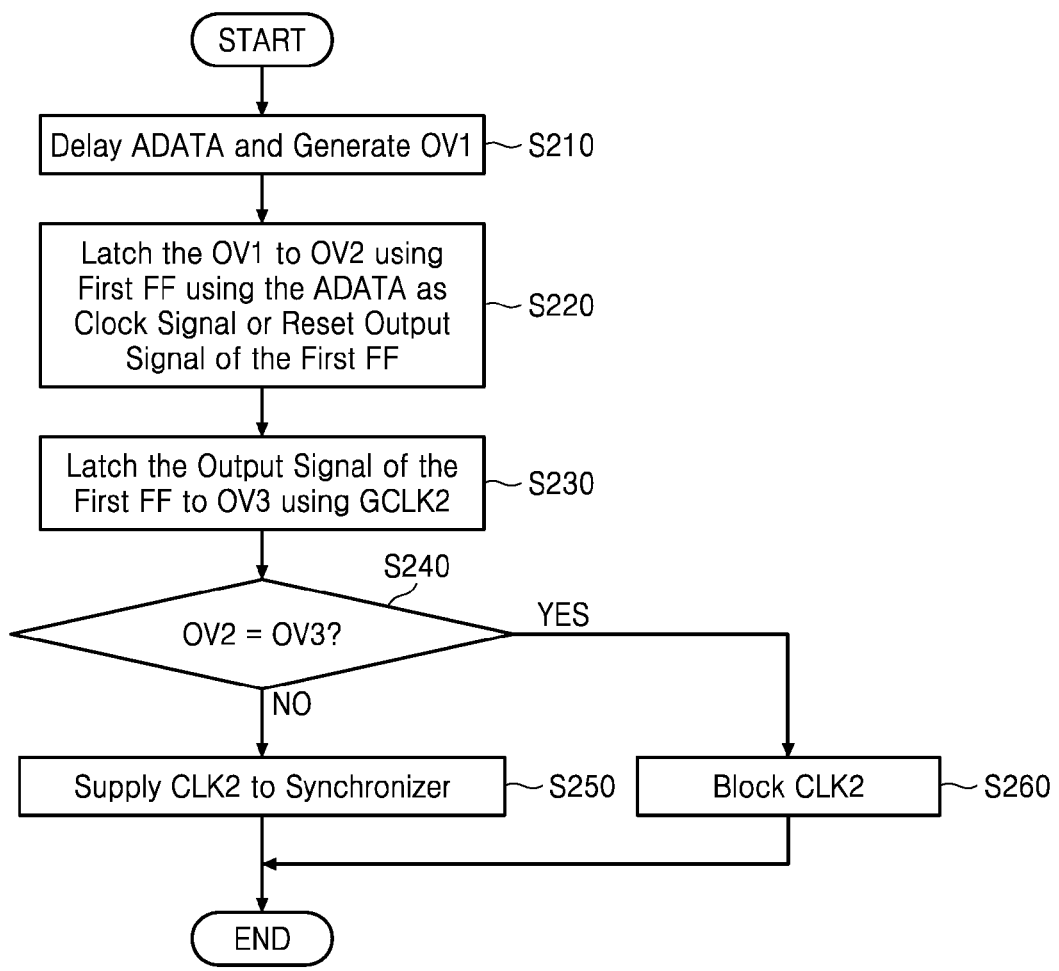
FIG. 6 is a flowchart which describes an operation of the synchronizer circuit shown in FIG. 2B.

FIG. 2B is a block diagram of an example of a synchronizer circuit 131A-2 that may be included in the receiver circuit 130 shown in FIG. 1 according to the present inventive concepts. FIG. 6 is a flowchart that describes an operation of the synchronizer circuit 131A-2 shown in FIG. 2B. Referring to FIGS. 1, 2B, and 6, the synchronizer circuit 131A-2 includes the delay circuit 132, the first flip-flop 134, the synchronizer 136, and the clock-gating circuit 140A.

The delay circuit 132 may receive and delay an asynchronous input signal, e.g., a data signal ADATA, received through the transmission medium 120, and output the first output value OV1 (S210).

When the data signal ADATA is a logic 1, the first flip-flop 134 latches the first output value OV1, i.e., logic 1, of the delay circuit 132, and when the data signal ADATA is logic 0, the first flip-flop 134 is reset (S220). That is, the first flip-flop 134 may latch the first output value OV1 to the second output value OV2 according to a logic value of the data signal ADATA or may be reset to logic 0. For example, the value that is at the Q output of the first flip-flop 134 changes from the second output value OV2 to the first output value OV1 according to a logic value of the data signal ADATA or the first flip-flop 134 may be reset to logic 0 (S220).

The first-stage D flip-flop 136-1 may latch the second output value OV2 to the third output value OV3 using the operation clock signal GCLK2 output from the clock-gating circuit 140A or maintain the third output value OV3 as it is (S230). That is, the value that is at the Q output of the first-stage D flip-flop 136-1 may change from the third output value OV3 to the second output value OV2 using the operation clock signal GCLK2 output from the clock-gating circuit 140A or it may remain the third output value OV3 (S230) if the operation clock signal GCLK2 is blocked.

A comparator 141 of the synchronizer circuit 131A-2 shown in FIG. 2B, unlike the comparator 141 of FIG. 2A, may compare the second output value OV2 with the third output value OV3 (S240).

When the second output value OV2 and the third output value OV3 are the same (YES in S240), the comparator 141 outputs a comparison signal EN having logic 0. Accordingly, since the second flip-flop 143 outputs the fourth output value OV4 having logic 0 in response to the falling edge of the second clock signal CLK2, the transmission control circuit 145 outputs the operation clock signal GCLK2 having logic 0. That is, the clock-gating circuit 140A does not supply the second clock signal CLK2 to the synchronizer 136 (S260), i.e., the second clock signal CLK2 is blocked.

When the second output value OV2 and the third output value OV3 are different (NO in S240), the comparator 141 outputs a comparison signal EN having logic 1. Accordingly, since the second flip-flop 143 outputs the fourth output value OV4 having logic 1 in response to the falling edge of the second clock signal CLK2, the transmission control circuit 145 outputs the second clock signal CLK2 as the operation clock signal GCLK2 having a logic 1. That is, the clock-gating circuit 140A supplies the second clock signal CLK2 to the synchronizer 136 (S250).

FIG. 3 is a timing diagram which describes an operation of the synchronizer circuit shown in FIG. 2A. It should be noted that the timing diagram shown in FIG. 3 is provided only for the purpose of conceptually describing an operation of the synchronizer circuit 131A-1 shown in FIG. 2A and should not be construed as limiting the scope of the inventive concepts described herein.

When an initial data signal ADATA is logic 0, each of the output values OV1, OV2, OV3, and OV4 is assumed to be logic 0.

At a first time T1, when the data signal ADATA transitions from logic 0 (low level) to logic 1 (high level), a reset of the first flip-flop 134 is released.

At a second time T2, the first output value OV1 transitions from logic 0 to logic 1 by the delay circuit 132. The comparator 141 outputs a comparison signal EN having logic 1 in response to a first output value OV1 having logic 1 and a third output value OV3 having logic 0. When the comparison signal EN is logic 1, the second flip-flop 143 outputs the fourth output value OV4 having logic 1 in response to the falling edge of the second clock signal CLK2. Accordingly, the transmission control circuit 145 outputs the second clock signal CKL2 as the operation clock signal GCLK2.

At a third time T3, the first flip-flop 134 outputs the second output value OV2 transitioning from logic 0 to logic 1.

At a fourth time T4, since the first-stage D flip-flop 136-1 outputs the third output value OV3 transitioning from logic 0 to logic 1 in response to the rising edge of the operation clock signal GCLK2, the comparator 141 outputs an enable signal EN having logic 0 based on the first output value OV1 having logic 1 and a third output value OV3 having logic 1. As the enable signal EN transitions from logic 1 to logic 0, the fourth output value OV4 at a fifth time T5 is logic 0. As a result, the transmission control circuit 145 blocks the second clock signal CLK2 supplied to the synchronizer 136.

From a fifth time T5 to a sixth time T6, the first output value OV1, the second output value OV2, and the third output value OV3 remain logic 1, and the fourth output value OV4 remains logic 0.

At a sixth time T6, when the data signal ADATA transitions from logic 1 to logic 0, the first flip-flop 134 is reset and the second output value OV2 becomes logic 0.

At a seventh time T7, when the first output value OV1 transitions from logic 1 to logic 0, the comparator 141 outputs a comparison signal EN having logic 1 in response to the first output value OV1 having logic 0 and the third output value OV3 having logic 1. When the comparison signal EN is logic 1, the second flip-flop 143 outputs a fourth output value OV4 having logic 1 in response to the falling edge of the second clock signal CKL2. Accordingly, the transmission control circuit 145 outputs the second clock signal CLK2 as the operation clock signal GCLK2.

At an eighth time T8, since the first-stage D flip-flop 136-1 outputs the third output value OV3 transitioning from logic 1 to logic 0 in response to the rising edge of the operation clock signal GCLK2, the comparator 141 outputs an enable signal EN having logic 0 based on the first output value OV1 having logic 0 and the third output value OV3 having logic 0. As the enable signal EN transitions from logic 1 to logic 0, the fourth output value OV4 at a ninth time T9 becomes logic 0. Accordingly, the transmission control circuit 145 blocks the second clock signal CLK2 supplied to the synchronizer 136.

There is a delay caused by the first-stage D flip-flop 136-1 between the rising edge of the second clock signal CLK2=GCLK2 and a transition of the third output value OV3.

Figure 7:
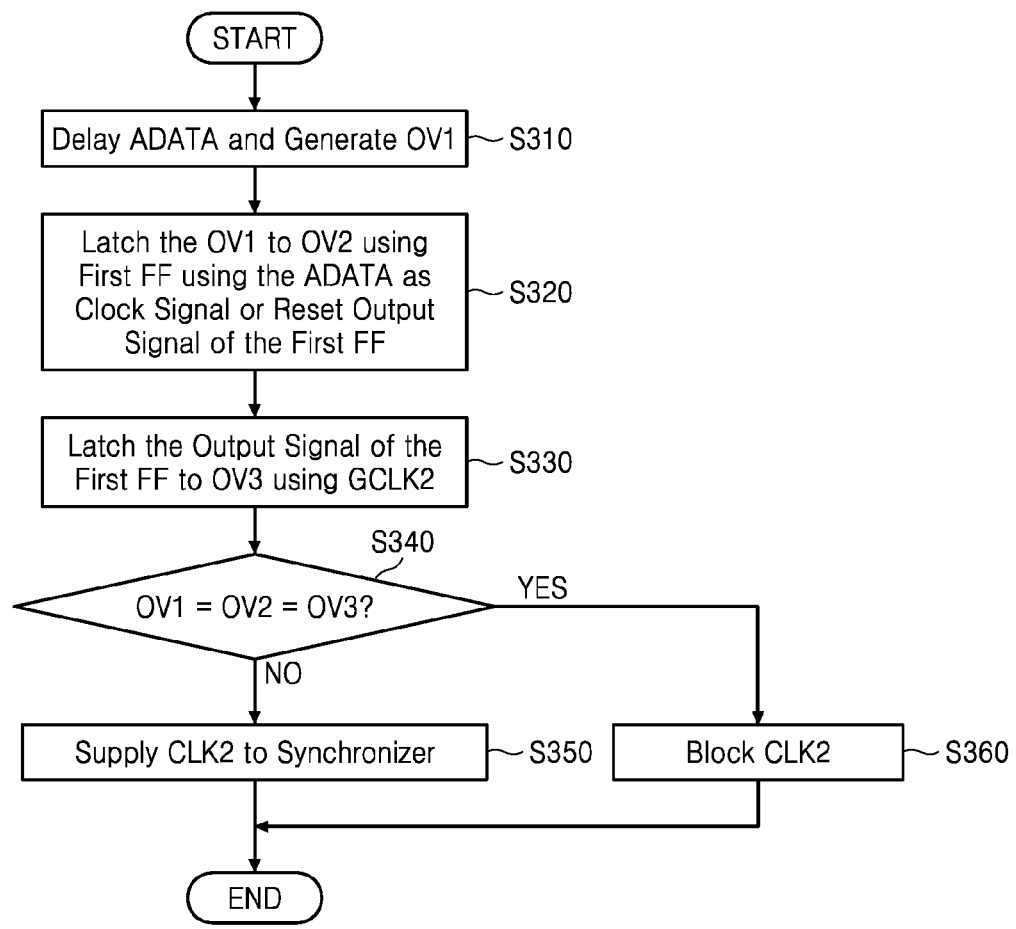
FIG. 7 is a flowchart which describes an operation of the synchronizer circuit shown in FIG. 4.

FIG. 4 is a block diagram of an example of the synchronizer circuit 131B included in the receiver circuit 130 shown in FIG. 1 according to the present inventive concepts. FIG. 7 is a flowchart that describes an operation of the synchronizer circuit 131B shown in FIG. 4.

Referring to FIGS. 4 and 7, the synchronizer circuit 131B may include the delay circuit 132, the first flip-flop 134, the synchronizer 136, and a clock-gating circuit 140B. Except for a structure of the clock-gating circuit 140B, the synchronizer circuit 131B of FIG. 4 is the same as the synchronizer circuit 131A-1 or 131A-2 of FIG. 2A or 2B, respectively, in structure.

The clock-gating circuit 140B determines whether to supply the second clock signal CLK2 to the synchronizer 136 in response to the first output value OV1 of the delay circuit 132, the second output value OV2 of the first flip-flop 134, and the third output value OV3 of the synchronizer 136. The third output value OV3 may be an output value of the first-stage D flip-flop 136-1.

The delay circuit 132 may receive and delay an asynchronous input signal, e.g., a data signal ADATA, received through the transmission medium 120, and output the first output value OV1 (S310).

When the data signal ADATA is logic 1, the first flip-flop 134 latches the first output value OV1, i.e., logic 1, of the delay circuit 132, and when the data signal ADATA is logic 0, the first flip-flop 134 is reset (S320). That is, the first flip-flop 134 may latch the first output value OV1 through the first flip-flop 134 from the D input to the Q output of the first flip-flop 134 according to a logic value of the data signal ADATA, or may be reset (S320).

The first-stage D flip-flop 136-1 may latch the second output value OV2 through the first-stage D flip-flop 136-1 from the D input of the D flip-flop 136-1 to the Q output of the D flip-flop 136-1 using the operation clock signal GCLK2=CLK2 output from the clock-gating circuit 140B. alternatively, if the operation clock signal GCLK2-CLK2 is blocked, the third output value OV3 will be maintained at the Q output of the D flip-flop 136-1.

The comparator 142 embodied in an exclusive OR gate may compare the first output value OV1, the second output value OV2, and the third output value OV3 with each other (S340).

When the first output value OV1, the second output value OV2, and the third output value OV3 are the same (YES in S340), the comparator 142 outputs a comparison signal EN having logic 0. Accordingly, since the second flip-flop 143 outputs an output signal OV4 having logic 0 in response to the falling edge of the second clock signal CLK2, the transmission control circuit 145 outputs the operation clock signal GCLK2 having logic 0. That is, the clock-gating circuit 140B does not supply (i.e., blocks) the second clock signal CLK2 to the synchronizer 136 (S360).

When the first output value OV1, the second output value OV2, and the third output value OV3 are not the same as each other (NO in S340), the comparator 142 outputs the comparison signal EN having logic 1. Accordingly, since the second flip-flop 143 outputs the fourth output value OV4 having logic 1 in response to the falling edge of the second clock signal CLK2, the transmission control circuit 145 outputs the second clock signal CLK2 as the operation clock signal GCLK2. That is, the clock-gating circuit 140B supplies the second clock signal CLK2 to the synchronizer 136 (S350).

It can be seen from the above description of examples of the inventive concepts that an integrated circuit having a synchronizer circuit used in different clock domains can have reduced power consumption, thereby increasing a battery lifetime of a mobile device including the synchronizer.

Although a few illustrative, or exemplary, embodiments have been shown and described herein for the purposes of demonstrating the inventive principles and concepts, it will be appreciated by those skilled in the art, in view of the description provided herein, that the invention is not limited to the embodiments described herein. Persons of skill in the art will understand that a variety of changes may be made in these embodiments within the scope of the invention.

What is claimed is:

1. An integrated circuit comprising:
   a delay circuit for receiving and delaying an asynchronous input signal;
   a first flip-flop having an input terminal connected to an output terminal of the delay circuit, a clock terminal for receiving the asynchronous input signal, and a reset terminal for receiving the asynchronous input signal;
   a synchronizer connected to an output terminal of the first flip-flop; and
   a clock-gating circuit for receiving a clock signal and determining whether to supply the clock signal to the synchronizer in response to one of a first output value of the delay circuit and a second output value of the first flip-flop and a third output value of the synchronizer.

2. The integrated circuit of claim 1, wherein when the asynchronous input signal has a first logic value, the first flip-flop latches the first logic value, and when the asynchronous input signal has a second logic value, the first flip-flop is reset.

3. The integrated circuit of claim 1, wherein when the one of the first output value and the second output value is the same as the third output value, the clock-gating circuit does not supply the clock signal to the synchronizer, and wherein when the one of the first output value and the second output value is different from the third output value, the clock-gating circuit supplies the clock signal to the synchronizer.

4. The integrated circuit of claim 1, wherein the clock-gating circuit comprises:
   a comparator for comparing the one of the first output value and the second output value with the third output value and generating a comparison signal;
   a second flip-flop for latching the comparison signal in response to a first edge of the clock signal; and
   a transmission control circuit for controlling transmission of the clock signal according to a level of an output signal of the second flip-flop.

5. The integrated circuit of claim 4, wherein the synchronizer comprises:
   a third flip-flop, the third flip-flop latching the second output value in response to a second edge of the clock signal output from the transmission control circuit, and
   a fourth flip-flop, the fourth flip-flop latching the third output value in response to the second edge of the clock signal output from the transmission control circuit, wherein the first edge is one of a rising edge and a falling edge, and the second edge is the other of the rising edge and the falling edge.

6. The integrated circuit of claim 1, wherein the clock-gating circuit determines whether to supply the clock signal to the synchronizer in response to the first output value, the second output value, and the third output value.

7. The integrated circuit of claim 6, wherein when the first output value, the second output value, and the third output value are the same value, the clock-gating circuit does not supply the clock signal to the synchronizer, and wherein when the first output value, the second output value, and the third output value are not the same value, the clock-gating circuit supplies the clock signal to the synchronizer.

8. The integrated circuit of claim 6, wherein the clock-gating circuit comprises:
   a comparator for comparing the first output value, the second output value, and the third output value with each other and generating a comparison signal;
   a second flip-flop for latching the comparison signal in response to a falling edge of the clock signal; and
   a transmission control circuit for controlling transmission of the clock signal according to a level of an output signal of the second flip-flop.

9. A data processing system comprising:
   a transmitter circuit operating using a first clock signal having a first frequency;
   a receiver circuit operating using a second clock signal having a second frequency different from the first frequency; and
   a transmission medium connected between the transmitter circuit and the receiver circuit, wherein the receiver circuit comprises,
   a delay circuit for receiving and delaying an asynchronous input signal received via the transmission medium at the first frequency,
   a first flip-flop having an input terminal connected to an output terminal of the delay circuit, a clock terminal for receiving the asynchronous input signal, and a reset terminal for receiving the asynchronous input signal,
   a synchronizer connected to an output terminal of the first flip-flop, and
   a clock-gating circuit for receiving the second clock signal and determining whether to supply the second clock signal to the synchronizer in response to one of a first output value of the delay circuit and a second output value of the first flip-flop and a third output value of the synchronizer.

10. The data processing system of claim 9, wherein when the asynchronous input signal has a first logic value, the first flip-flop latches the first logic value, and wherein when the asynchronous input signal has a second logic value, the first flip-flop is reset.

11. The data processing system of claim 9, wherein when the one of the first output value and the second output value is the same as the third output value, the clock-gating circuit does not supply the second clock signal to the synchronizer, and wherein when the one of the first output value and the second output value is not the same as the third output value, the clock-gating circuit supplies the second clock signal to the synchronizer.

12. The data processing system of claim 9, wherein the clock-gating circuit comprises:
a comparator for comparing the one of the first output value and the second output value with the third output value and generating a comparison signal;
a second flip-flop for latching the comparison signal in response to a first edge of the second clock signal; and
a transmission control circuit for controlling transmission of the second clock signal according to a level of an output signal of the second flip-flop.

13. The data processing system of claim 12, wherein the synchronizer comprises:
a third flip-flop, the third flip-flop latching the second output value in response to a second edge of the second clock signal output from the transmission control circuit, and
a fourth flip-flop, the fourth flip-flop latching the third output value in response to the second edge of the second clock signal output from the transmission control circuit, wherein the first edge is one of a rising edge and a falling edge, and the second edge is the other of the rising edge and the falling edge.

14. The data processing system of claim 13, wherein the clock-gating circuit determines whether to supply the second clock signal to the synchronizer in response to the first output value, the second output value, and the third output value, and wherein the clock-gating circuit does not supply the second clock signal to the synchronizer when the first output value, the second output value, and the third output value are the same value, and wherein the clock-gating circuit supplies the second clock signal to the synchronizer when the first output value, the second output value, and the third output value are not the same value.

15. The data processing system of claim 9, wherein the transmitter circuit and the receiver circuit are integrated in a same semiconductor chip.

16. The data processing system of claim 9, wherein the transmitter circuit and the receiver circuit are integrated in separate semiconductor chips.

17. A method of performing clock-gated synchronization in a synchronizer circuit, the method comprising:
delaying an asynchronous input signal to the synchronizer circuit to produce a delayed asynchronous input signal;
receiving the delayed asynchronous input signal at an input terminal of a first flip-flip of the synchronizer circuit and latching the delayed asynchronous input signal into the first flip-flop;
applying the asynchronous input signal to a clock terminal of the first flip-flop and applying an inverse of the asynchronous input signal to a reset terminal of the first flip-flop;
receiving an output signal of the first flip-flop at an input terminal of a synchronizer of the synchronizer circuit;
receiving a clock signal at a clock-gating circuit of the synchronizer circuit; and
in the clock-gating circuit, determining whether to supply the clock signal to the synchronizer based on values of the asynchronous input signal over a time period made up of multiple cycles of the clock signal.

18. The method of claim 17, wherein clock-gating circuit makes the determination by comparing at least one of the delayed asynchronous input signal received at the input terminal of the first flip-flip and the output signal of the first flip-flop received at the input terminal of the synchronizer with an output signal output from an output terminal of the synchronizer.

19. The method of claim 18, wherein the synchronizer comprises at least second and third flip-flops connected in series to one another, the second flip-flop having an input terminal that is connected to the output terminal of the first flip-flop and having an output terminal that is connected to an input terminal of the third flip-flop, and wherein said output signal output from an output terminal of the synchronizer is an output signal output from the output terminal of the second flip-flop and received at the input terminal of the third flip-flop.

20. The method of claim 17, wherein clock-gating circuit makes the determination by comparing the delayed asynchronous input signal received at the input terminal of the first flip-flip, the output signal of the first flip-flop received at the input terminal of the synchronizer and an output signal output from an output terminal of the synchronizer with one another.

* * * * *